United States Patent

Matsushita et al.

[15] 3,686,684

[45] Aug. 22, 1972

[54] SEMICONDUCTOR CIRCUITS

[72] Inventors: Takeshi Matsushita, Atsugi; Hajime Yagi, Tokyo, both of Japan

[73] Assignee: Sony Corporation, Tokyo, Japan

[22] Filed: May 26, 1970

[21] Appl. No.: 40,539

[30] Foreign Application Priority Data

May 28, 1969 Japan ......................44/41576
May 28, 1969 Japan ......................44/41577
May 28, 1969 Japan ......................44/41578

[52] U.S. Cl.........317/235 R, 317/235 K, 317/235 L, 317/235 AM, 317/235 UA, 317/235 Y, 317/235 N, 307/302

[51] Int. Cl.........H01l 11/00, H01l 15/00, H01l 9/12

[58] Field of Search...... 317/235 K, 235 L, 235 AM, 235 UA,317/235 Y, 235 W, 235 AD; 307/302, 299, 286

[56] References Cited

UNITED STATES PATENTS

| | | | |
|---|---|---|---|
| 3,457,468 | 7/1969 | Kawaji | 317/234 |
| 3,424,910 | 1/1969 | Mayer | 250/211 |
| 3,457,468 | 7/1969 | Kawaji | 317/234 |

*Primary Examiner*—Martin H. Edlow
*Attorney*—Lewis H. Eslinger, Alvin Sinderbrand and Curtis, Morris and Safford

[57] ABSTRACT

An electric circuit which exhibits negative impedance characteristics. Several embodiments are shown for producing "N" shape, "S" shape, and modified "N" shape negative impedance characteristics. The circuit includes a semiconductor device of the kind having three independent regions on a substrate, and a pair of bias sources; one source is applied between two of the regions, and the other is applied at least to the third region. By suitable bias arrangements the negative impedances are produced.

26 Claims, 33 Drawing Figures

INVENTORS
TAKESHI MATSUSHITA
HAJIME YAGI
BY
[signature]
ATTORNEY

INVENTORS
TAKESHI MATSUSHITA
HAJIME YAGI
BY

ATTORNEY

INVENTORS
TAKESHI MATSUSHITA
HAJIME YAGI
BY

ATTORNEY

INVENTORS
TAKESHI MATSUSHITA
HAJIME YAGI

INVENTORS
TAKESHI MATSUSHITA
HAJIME YAGI

BY

ATTORNEY

Patented Aug. 22, 1972 3,686,684

INVENTORS
TAKESHI MATSUSHITA
HAJIME YAGI
BY

ATTORNEY

INVENTORS
TAKESHI MATSUSHITA
HAJIME YAGI

BY

ATTORNEY

Patented Aug. 22, 1972 3,686,684

9 Sheets-Sheet 8

INVENTORS
TAKESHI MATSUSHITA
HAJIME YAGI
BY

ATTORNEY

INVENTORS
TAKESHI MATSUSHITA
HAJIME YAGI
BY

ATTORNEY

SEMICONDUCTOR CIRCUITS

This invention relates to electric circuits utilizing a semiconductor device, and particularly to circuits which exhibit negative resistance characteristics.

The search for negative resistance circuits is classic in electrical engineering. This invention relates to new negative resistance circuits.

The semiconductor device utilized in this invention comprises a semiconductor substrate and at least three independent regions therein, having a selected conductive type, which are respectively provided with an electrode thereon. This device is disclosed in copending U.S. applications, Ser. Nos. 873,162 and 873,399, both filed on Nov. 4, 1969 and assigned to the same assignee as the present application.

The circuit construction is briefly described as follows. The semiconductor device is connected to a first bias source which applies a bias voltage or current between two of the electrodes. The device is connected to a second bias source, such as an operating DC voltage source, which applies a voltage, with suitable polarity, between one of the above two electrodes and the third electrode. Further, a current detecting or load device, is provided in series to the second bias source for detecting a current flowing therethrough. In such a circuit the relation of current variations as detected by the current detecting device changes of the voltage of the second bias source (I–V response) exhibits a negative resistance characteristic.

An object of this invention is to provide a new semiconductor circuit exhibiting negative impedance characteristics.

A further object of the invention is to provide new semiconductor circuits exhibiting negative resistance characteristics of "N" shape, "S" shape, and modified "N" shape.

According to the invention there is provided a circuit comprising a semiconductor device having a low conductivity substrate with three higher conductivity regions therein, a first one of these regions is of one conductivity type, a second of the regions is of the opposite conductivity type, and a third of said regions is one of the one conductivity type as the first region; and means are provided for forwardly biasing the first and second regions and for biasing the third region. In one specific embodiment, the third region is selectively reverse biased and forward biased for producing a negative impedance between the regions of one conductivity and the region of the opposite conductivity as the bias means applies forward bias or reverse bias to the third region. In further embodiments, the third region is reverse biased relative to the first region or to the second region. Furthermore, both current and voltage bias are used.

The construction of illustrative embodiments as well as further objects and advantages thereof, will become apparent when read in conjunction with the accompanying drawings wherein.

Figure 1:
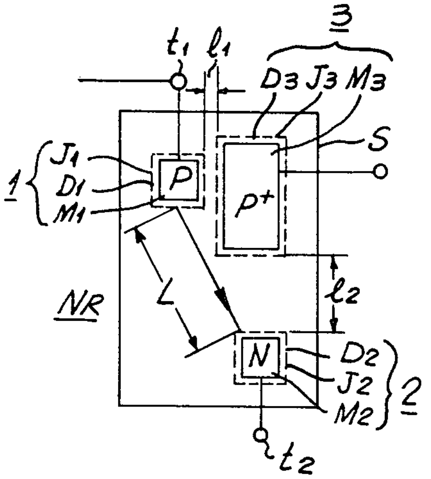
FIG. 1 is a plain view of a semiconductor device utilized in the circuit of this invention.

In FIG. 1 there is shown a semiconductor device NR which may be utilized in the circuit of this invention. The device has a semiconductor substrate s, which is preferably formed of germanium, silicon, III–V compounds, or other intermetallic compound. In the present example the substrate s is silicon having a low conductivity N-type impurity, with a concentration of approximately $10^{15}$ atoms/cm$^3$. The concentration is not critical, in fact the substrate need not be doped at all, and an intrinsic substrate may be used. A first region 1 is formed on the substrate s and is adapted to inject carriers into the substrate S. The first region 1 includes a P-type impurity region D1 (formed by any convenient method, such as by diffusion). The PN junction edge between region D1 and the substrate S is shown with legend J1. A metallic electrode layer M1 overlies the P region D1 and makes an ohmic contact with the region D1. A lead and $t1$ terminal are brought out from the electrode M1.

A second region 2 is on the substrate, separate from region 1 by a distance L, and is designed to inject carriers into the substrate s which are different from the carriers to be injected from region 1 into the substrate S. The second region 2 comprises an N+ type impurity region D2 (formed for example by a diffusion method) and an overlying metallic electrode layer M2 which is in ohmic contact with the region D2. An external terminal *t*2 is connected to electrode M2. Further, the impurity concentration of the region D2 is higher than the concentration of the substrate S. The junction between the region D2 and the substrate is shown by the legend J2.

A third region 3 is on the substrate and is designed to be able to inject carriers into the substrate S. The third electrode 3 comprises a P-type impurity region D3 formed, for example, by a diffusion method and makes a P-N junction at its edge with the substrate S. A portion of the edge of the P-N junction is shown with legend J3. A metallic electrode layer M3 overlies, and is in ohmic contact with the P region D3. Electrode M3 has an associated lead wire and terminal *t*3.

The three regions 1,2, 3 are on the same surface of the substrate and are relatively positioned with the second region 2 farthest from the first region 1 and separated by a distance L; and the third region 3 is close to the first region 1 separated by a distance $l_1$. The second and third regions are separated by an intermediate distance shown here as $l_2$.

The semiconductor device of FIG. 1 can be combined in circuit, and as various biases are applied to each of the electrodes, the device will exhibit various negative resistance characteristics. In one embodiment an "N" shape is provided, in another an "S" shape is produced, and in a third a modified "N" is obtained.

Figure 2:
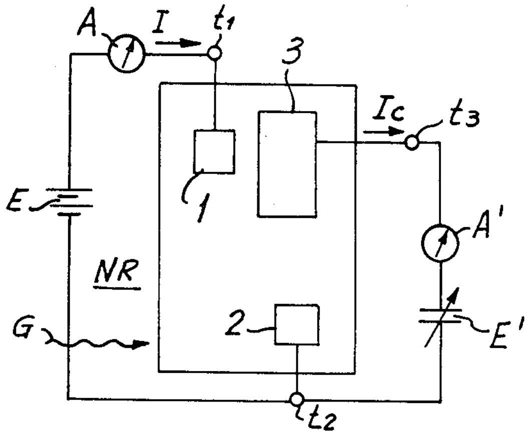
FIG. 2 is a schematic drawing of a circuit of one embodiment of this invention, including a plain view of the semiconductor device in the circuit.
Figure 3A:
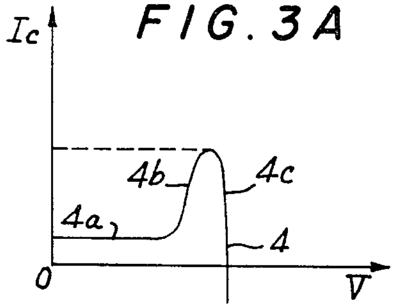
FIGS. 3A and 3B are characteristic curves for FIG. 2.
Figure 3B:
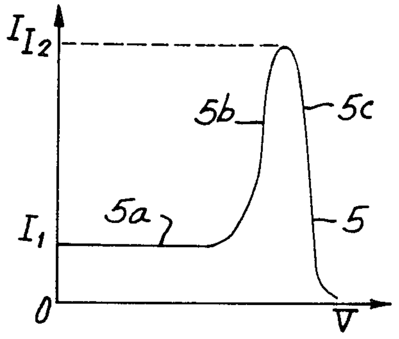

With the circuit of FIG. 2 there can be produced an N-shaped negative resistance characteristic of the kind shown in FIGS. 3A and 3B. In FIG. 2 the device NR is connected with a voltage source E between its terminals *t*1 and *t*2 so that regions 1 and 2 are forward biased. A second voltage source E' is connected between terminals *t*3 and *t*2 to forward bias the regions 3 and 2. Source E' is shown as a variable voltage source whose output is a voltage V which is plotted in FIGS. 3A and 3B. An ammeter A connected in series with the source E' and terminal *t*1 measures the electric current I following between terminals *t*1 and *t*2. Another ammeter A' connected between E' and terminal *t*3 measures the electric current Ic following between terminals *t*3 and *t*2. The results of measurement of current Ic and I by meters A' and A are shown respectively in FIGS. 3A and 3B in which current variations are plotted against variations of the voltage V from source E'. It may be noted that the charted V–I curves show an N-shaped negative resistance characteristic.

Figure 4A:
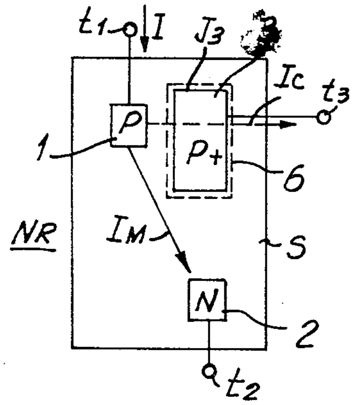
FIGS. 4A, 4B and 4C are plain view drawings of the device of FIG. 2 used in the explanation of the operation of the circuit of FIG. 2.
Figure 4B:
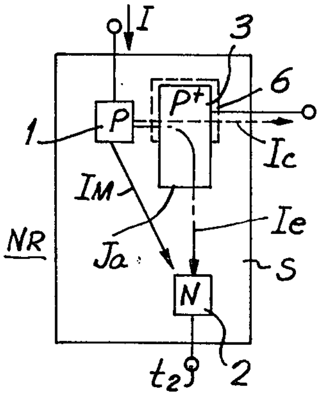
Figure 4C:
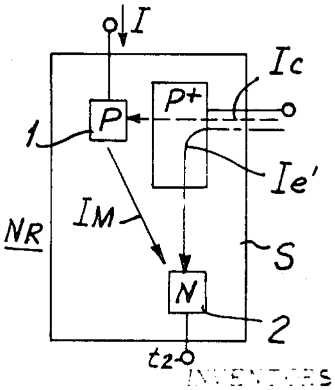

The operation of the circuit of FIG. 2 can be qualitatively explained by referring to FIGS. 3A, and 3B, and FIGS. 4A, 4B, and 4C. FIGS. 4A, 4B, and 4C show only the device NR of FIG. 2, it being understood that the device is connected to the sources as shown in FIG. 2. The forward bias supplied between terminals *t*1 and *t*2 by the source E' produces a current IM flowing between the regions 1 and 2 through the substrate S whereby holes and electrons are injected from the regions 1 and 2, respectively, into the substrate S. When the voltage value V of source E' is low (as shown in FIG. 4A) the junction J3 is reverse biased due to the forward bias between regions 1 and 2, and a depletion layer 6 is formed around the junction J3. Nonetheless, part of the holes injected from the first region 1 flow to the terminals *t*3 through the third region 3. This is shown in FIG. 4A as current Ic, and is also depicted in FIG. 3A as a portion 4*a* of the curve 4. The current I flowing into terminal *t*1 from source E is the sum of currents IM and IC and is shown in FIG. 4B as region 5*a* on curve 5 as having an amplitude I1.

When the voltage V from the source E' increases, the depletion layer 6 opposite to the region 2 changes. As shown in FIG. 4B part Ja of the previous depletion layer 6 closest to the region 2 becomes forward biased. Thus (due to some of the holes which are injected into the substrate s at region 1) a current Ie flows from the first electrode *t*1 to the second electrode *t*2 through the third region 3. The current I flowing into electrode *t*1 is divided into three components, Im, Ic, and Ie The impedance among the regions 1, 2, 3 is such that the current Ie becomes large rapidly and the total current I becomes large too, as shown in FIG. 3B part 5*b* on curve 5. As the voltage V increases, the current reaches its maximum at an amplitude I2. The current Ic also becomes large as shown in part 4*b* on curve 4, i.e. the current Ic also increases while the current I increases due to the lowering of bias at Ja on region 3.

When the voltage V of the source E' is further increased, it changes the bias between regions 1 and 2 so that the third region 3 no longer collects the holes which were injected from the first region 1, but the third region becomes a source to inject holes into the substrate S. Thus the current Ic changes direction. As shown in FIG. 3A, region 4*c* on curve 4, the current Ic is first rapidly reduced in amplitude and then flows in the opposite direction. In the device NR, a current Ie flows between regions 3 and 2.

As the voltage V first is increased in this range, holes are injected from the third region 3 to the first region 1. As the voltage V is further increased, the resistance of the substrate 3 is reduced, and the current I increases and reaches at the value I2 in FIG. 3B. As the voltage V, is still further increased, the electric potential of substrate s around the first region 1 increases, so that the first region 1 becomes partially reversed bias and the injection of holes becomes reduced. Therefore, the current I rapidly reduces as shown in FIG. 3B as region 5*c* on curve 5. Accordingly, the embodiment shown in FIG. 2 shows a negative resistance characteristic.

The negative resistance characteristic is produced by the biases on the device NR. It should be noted that the third region 3 is close to the first region 1. The negative resistance characteristic results from the impedance change between the first and second regions 1 and 2, which are due to the change of electric potential of the third region 3. The change of this impedance between regions 1 and 2 is greater when the third region 3 is closer to the first region 1. So it should be noted that the distance $l_1$between the regions 1 and 3 is shorter than the distance L between regions 1 and 2, and also shorter than the distance $l_2$ between electrodes 1 and 3, namely $l_1 < l_2 < L$.

Figure 5:
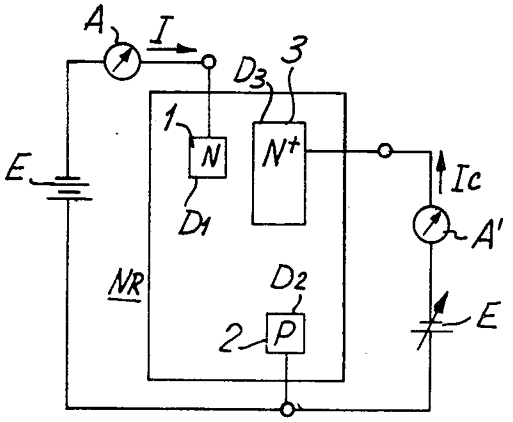
FIG. 5 is a schematic drawing of an alternative circuit of the embodiment of FIG. 2.

FIG. 5 shows a circuit similar to FIG. 2 but in which the device is of the opposite conductivity type and the polarity of the voltage sources E and E' are reversed. Also the direction of measured current flow I and Ic are reversed. In FIG. 5 the substrate s is of low conductivity P type, and the regions D1, D2 and D3 are respectively of N, P, and N type impurity. The impurity type is shown on the drawing. The operation is the same as that of FIG. 2, and the resulting curves for the operation of the circuit of FIG. 5 are the same as the curves of FIGS. 3A and 3B. The device NR in FIG. 5 may be termed a P type device, and the one in FIG. 2 as an N type device.

Figure 6:
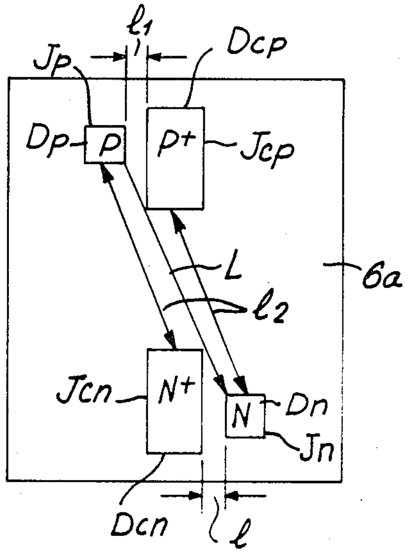
FIG. 6 is a plain view of an alternative semiconductor device to be used in the circuit of this invention.

FIGS. 6–9 illustrate a variation on the first embodiment of the circuit in which there is used a slightly different device 6*a*, than the device NR of FIGS. 2 and 5. The device 6*a* shown in FIG. 6 can operate not only as a P-type device, but also as an N-type device. An impurity region DP of P type is formed on a common substrate s. The region DP is used as a first region when operated as a N device; and as a second region when operated as a P device. A diffused region DN of N-type impurity is formed on the common substrate S. This region is used as second region when device 6*a* operates as a P device and is used as a first region for N-type device operation. A P-type high impurity region Dcp is formed on the substrate *s*. The region Dcp is used as a third region for an N-type device. An N-type high impurity region Dcn is formed on the substrate S and this region is used as a third electrode for a P-type device. Jn, Jp, Jcp, and Jcn are shown as the rectifying junction edges which may be formed by the regions Dp, Dn, Dcp, and Dcn. The metallic layers associated with each region, and the terminals are not shown pictorially but are understood to be included in the device 6*a*. The regions Dp and Dcp, as well as the regions Dn and Dcn, are separated from each other by a small distance $l_1$. Regions Dp and Dn are separated respectively from regions Dcm and Dcp by a longer distance $l_2$. Finally, the regions Dp and Dn are separated from each other by the longest distance, which is shown in FIG. 6 as distance L.

In this embodiment, the substrate S is formed of a silicon semiconductor which is, for example, of P-type low impurity concentration having a resistivity of 450–600Φ%-cm. A typical substrate S has a thickness of 100$\mu$. A typical size of the region Dp or Dn is a square having side length of 30$\mu$. A typical size of the region Dcp or Dcn is a length of 195$\mu$ and a width of 75$\mu$. The depth of the regions Dcp, Dp, Dn and Dcn is 3$\mu$ each. The distance $l_1$ between regions Dp and Dcp is 30$\mu$ as is the distance $l_1$ between regions Dcn and Dn. The distance $l_2$ between the regions Dp 250$\mu$. Dcn and between the regions Dcp and Dn is 250$\mu$. The distance L between the regions Dp and Dn is 350$\mu$.

Figure 7:
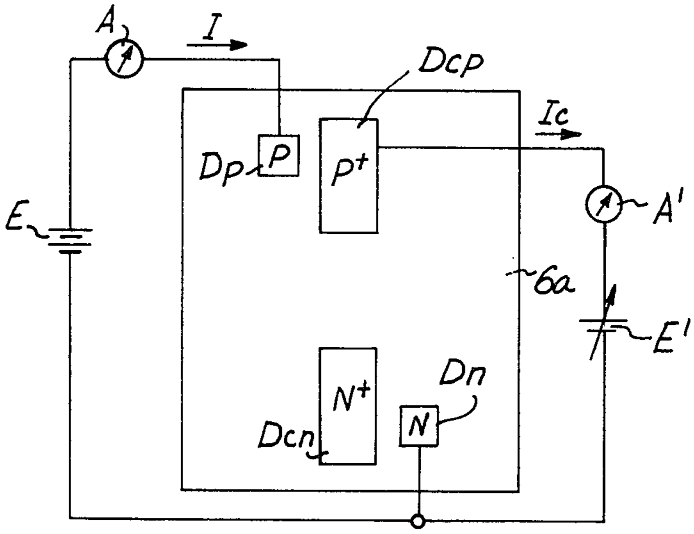
FIGS. 7 and 9 are schematic drawings of one embodiment of the circuit of this invention applied to the device of FIG. 6.

The device of FIG. 6 is shown connected in one circuit configuration in FIG. 7. The circuit of FIG. 7 is similar to the one of FIG. 2, and common elements to both FIGS. are identified by the same reference characters. In FIG. 7 the first region is Dp; the second region is Dn, and the third region is Dcp. The region Dcn is not used. The currents I and Ic versus variation of voltage V from source E′ are shown as curves 7 and 8 in FIG. 9, and depict a negative resistance characteristic.

Figure 8:
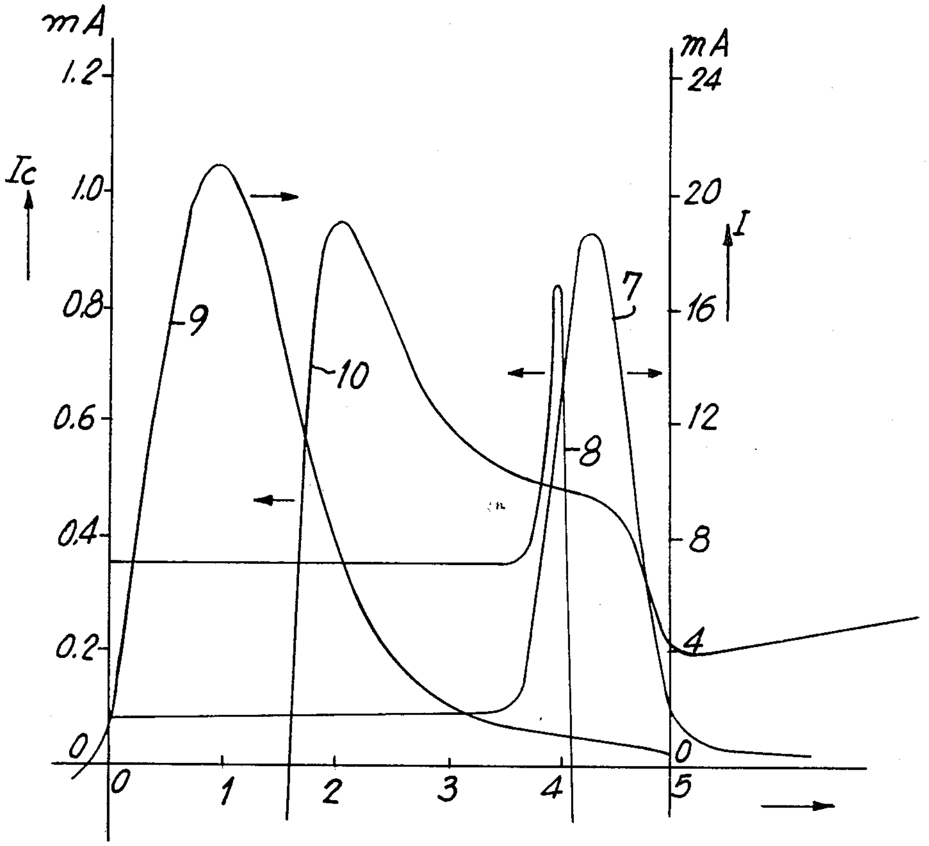
FIG. 8 is a graph showing a characteristic curves for the circuits of FIGS 7 and 9.
Figure 9:
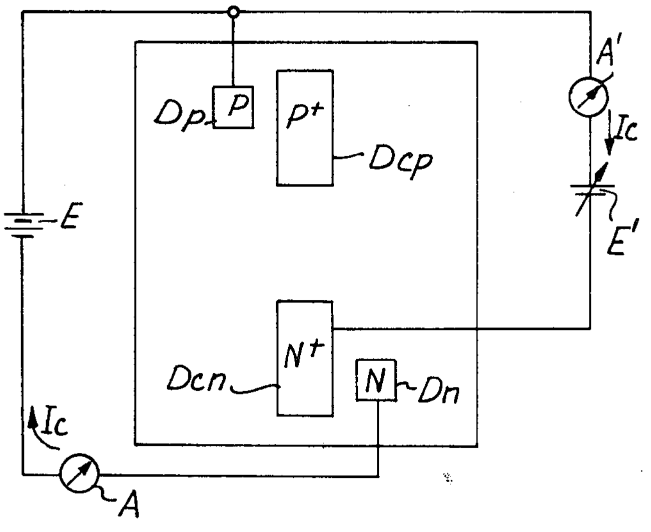

The device shown in FIG. 6 may be connected in a circuit similar to FIG. 5 as is shown in FIG. 9. In FIG. 9 the first region is the region Dn; the second region is the region Dp; and the third region is the region Dcn. The currents I and Ic versus voltage V are shown as curves 9 and 10 in FIG. 8 and show a negative resistance characteristic. A typical scale of values is shown in FIG. 8.

Figure 10A:
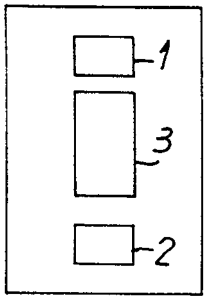
FIGS. 10A and 10B are plain views of still another device to be used in the circuit of the invention.
Figure 10B:
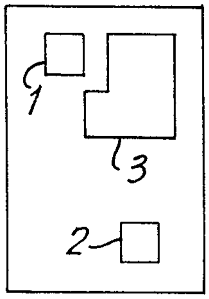

FIGS. 10A and 10B show devices which may be used in the circuits in place of the devices NR or 6*a* shown in the previous circuits. The devices of FIGS. 10A and 10B are similar to those of FIGS. 1 or 5 and differ from the previous devices primarily in the geometry and the location of the regions 1, 2, 3 on the substrate. The space between regions 1 and 3 is smaller than the space between regions 2 and 3, and the space between regions 1 and 2 is the largest.

The negative resistance voltage current characteristic of the circuit may be changed by applying an external light or magnetic field to the devices. This is shown schematically in FIG. 2 by the line G. For example, when light is applied to the substrate S, the carriers in the substrate increase so that the current Im increases. It is the same as if the voltage of the source E increased substantially. Also, when an external magnetic field of one polarity is applied to the substrate s, the carriers are forced to follow curved lines substantially the entire distance between electrodes 1 and 2, and, therefore, the impedance increases, and the current is reduced. The reverse effect follows from a reversed polarity.

Figures 11, 12, 13:
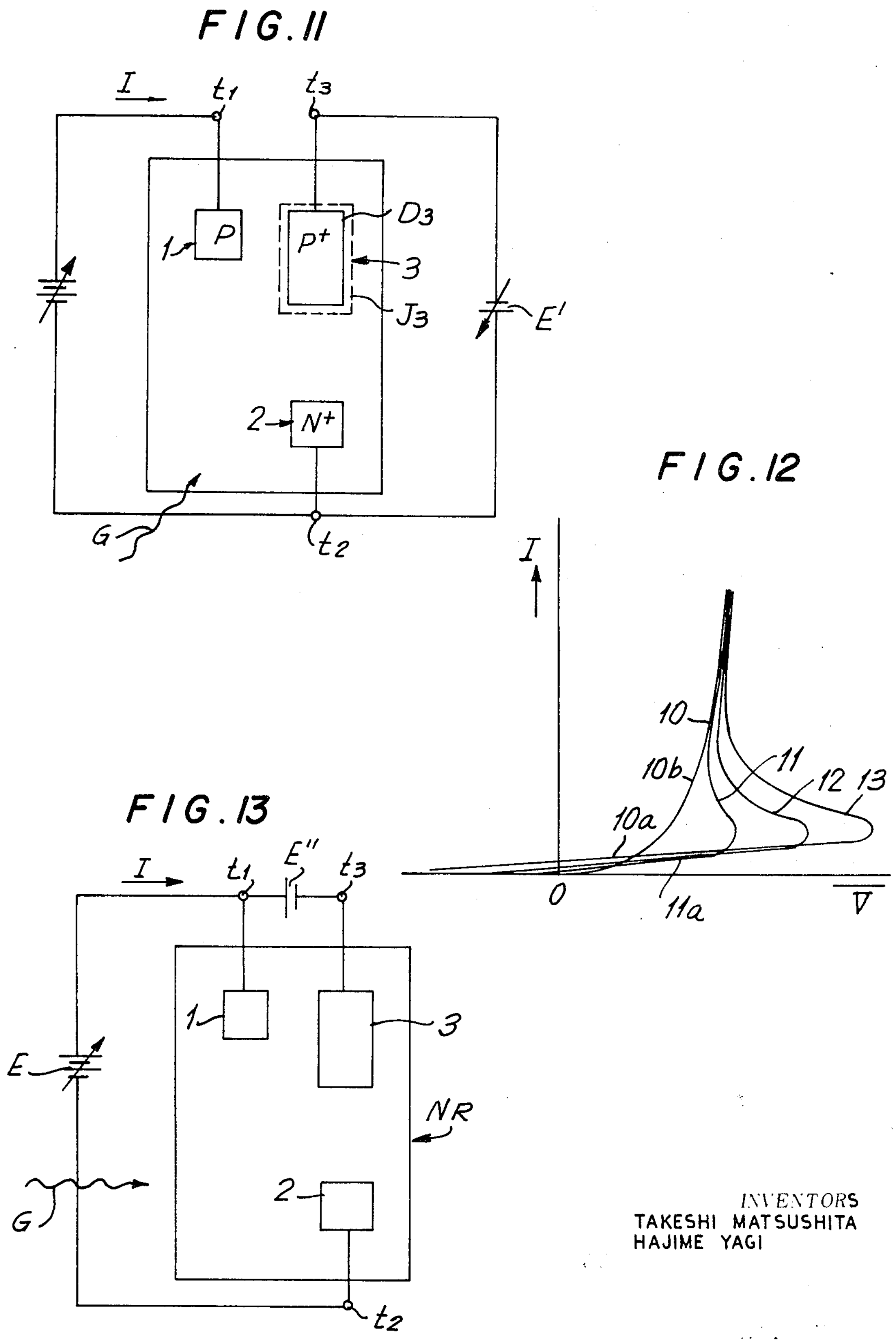
FIG. 11 is a schematic drawing of a circuit of a second embodiment of the invention.
FIG. 12 is a graph showing characteristic curves for the circuit of FIG. 11.
FIG. 13 is a schematic drawing of a variation of the circuit of FIG. 11.

A second embodiment is shown in FIG. 11 and the voltage-current characteristics of a portion of the circuit of FIG. 11 are shown in FIG. 12. In FIG. 11, a device NR is the same as the device NR of FIG. 1, and similar reference characters are used in both figures and throughout the rest of the application. A voltage V from a potential source E is applied between the first region 1 and the second region 2 for forward biasing these regions. A load (not shown) is connected in series with the source E. A current flowing into the first terminal is designated I and its direction of positive flow is shown by the arrow below the legend I. A second source of potential E′ is connected between the second and third regions for reverse biasing said regions. In FIG. 12 the voltage across terminals *t*1–*t*2 is plotted against the current I for variations of the voltage V from source E. Curves 10, 11, 12, 13 are the different characteristic curves for different values of voltage of the source E′, i.e. for different biases of the third region. It will be noticed that for certain values the VC characteristic shows an "S" shape negative resistance characteristic.

The principle of the operation may be explained qualitatively as follows. When the electric potential of the third region 3 is the same as the electric potential of the first region 1, the output characteristic curve 10 appears the same as the characteristic of a double injection type diode, for small values of voltage. V as shown in part 10*a* on curve 10 in FIG. 12, there is an ohmic characteristic. This characteristic continues while the voltage V is at a low level. However, when the voltage V increases, the carriers which are injected from the first and second regions 1 and 2 into the substrate s increase, and the conductivity of the substrate increases i.e. its impedance decreases). This characteristic is shown as part 10*b* on curve 10.

However, when the reverse bias from source E′ is applied between the regions 2 and 3, a depletion layer J3 is formed around the region D3. In this condition, when the positive voltage V is supplied to the first electrode 1 against the second electrode 2, and when the voltage V increases, the holes which are injected from the first region 1 are collected by the third region 3 which is reverse biased. Accordingly, very few of the electrons are injected into the substrate S from the third electrode 3. The impedance between the regions 1 and 2 is therefore large, and only a small quantity of current I flows. This is shown in FIG. 12 as part 11*a* on curve 11. As the voltage V of source E increases, the impedance of device NR between the regions 1 and 2 falls off and the device exhibits a negative impedance region. After this, the device then operates as an ohmic device shown on FIG. 12 as the meeting of curves 10 and 11. As the voltage from source E′ is made larger, the knee, or break-over point, becomes larger. FIG. 12 shows two more such curves, 12 and 13. Each curve, 11, 12 and 13 represents successively large values of the voltage from source E′.

In FIG. 11, the source E′ is connected between regions 2 and 3. However, as shown in FIG. 13, it is possible to connect a source E′ between regions 1 and 3. The source E″ in this example with an n device NR biases the region 3 negative in relation to region 1.

Figure 14:
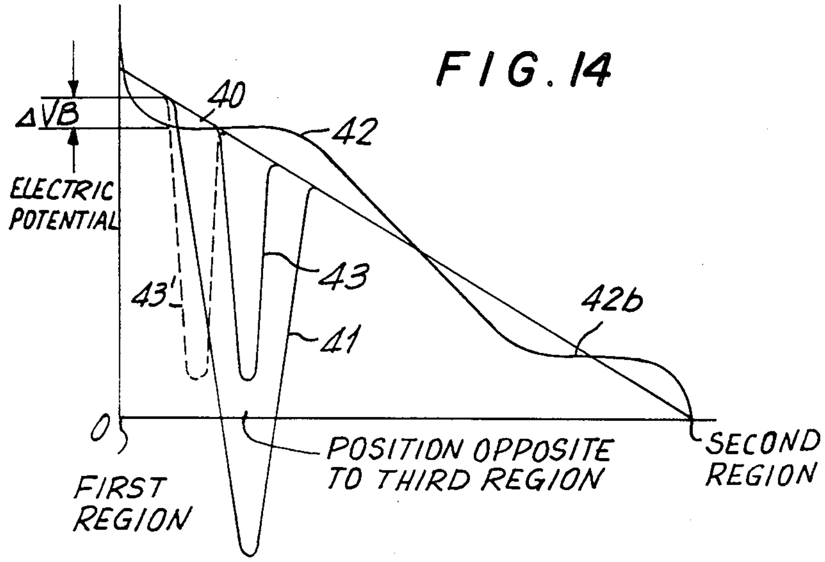
FIG. 14 is a graph showing the distribution of electric potential in the device as connected in a circuit.

FIG. 14 is a graph showing the distribution of electrical potential between the first and second regions 1 and 2 of the device NR when it is connected in the circuit of FIG. 11.

A distribution of electric potential between the regions 1 and 2 when the circuit is operation without region 3 back biased (e.g. with source E′ being open circuited) is shown on line 40. In other words, potential line 40 represents the potential while there is no influence due to a bias on the third region 3, and there is no conductivity modulation. When the reverse bias is supplied to the third region 3, depletion layer J3 is formed and as shown in FIG. 14 a potential valley 41 occurs around the third region 3. In this time, when the forward bias between the electrodes 1 and 2 increases (and the conductivity modulation occurs) the distribution of electric potential in the substrate s changes from a straight line potential 40 to a variable potential shown as curve 42. Parts 42*a* and 42*b* on line 42 show lower electric potential than line 40. Accordingly, if the position of the third electrode 3 is selected so as to extend the valley (i.e. depletion layer to the part 42) then the electric potential around the depletion layer of the third region 3 is reduced by ΔVB. Thus if the potential reduces said portion, the reverse bias is reduced, and the depletion layer is contracted. Accordingly, the collection effect of the third electrode 3 is reduced, and holes are injected from the first region 1 into the substrate s so that the density of carriers in substrate s is higher and the conductivity modulation is larger and the depletion layer is contracted further. Thus, the negative resistance characteristic notably appears, by said positive feedback function.

In FIGS. 11 and 13 the third region 3 is biased by a negative voltage, but the embodiment is not to be so limited because it is possible that the reverse bias is supplied substantially to the third electrode 3 by other means. For example, when the circuit between the electrodes 2 and 3 is a short circuit, the third electrode 3 is substantially biased negatively, so that a negative resistance characteristic is achieved. Further, the distribution of electric potential in part for carriers between the regions 1 and 2 in the substrate S has a valley as shown on line 43 in FIG. 14. Accordingly, in this case, the position of the third electrode 3 is selected so as to extend the valley to the part 42*a* as shown in curve 43, in FIG. 14.

Figure 15:
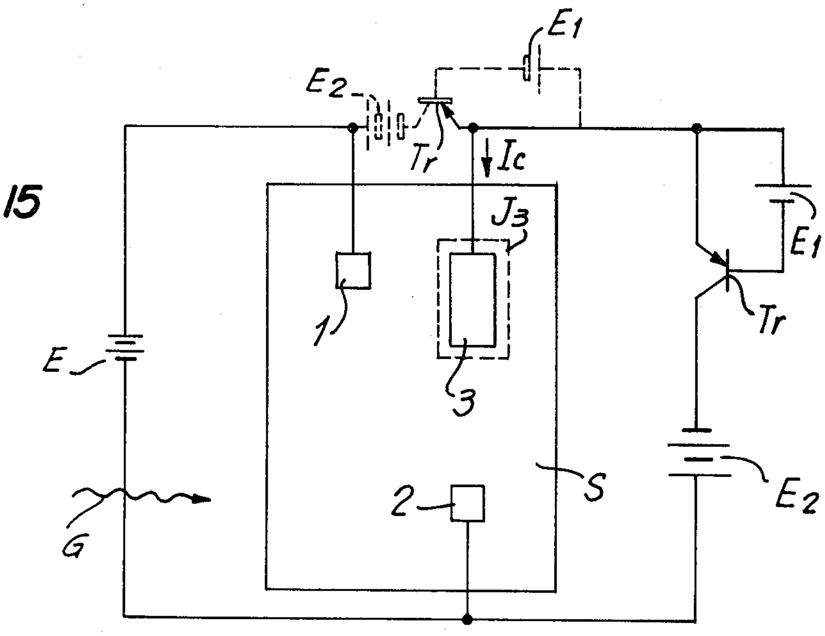
FIG. 15 is a schematic drawing of circuit illustrating a variation of the second embodiment.
Figure 16:
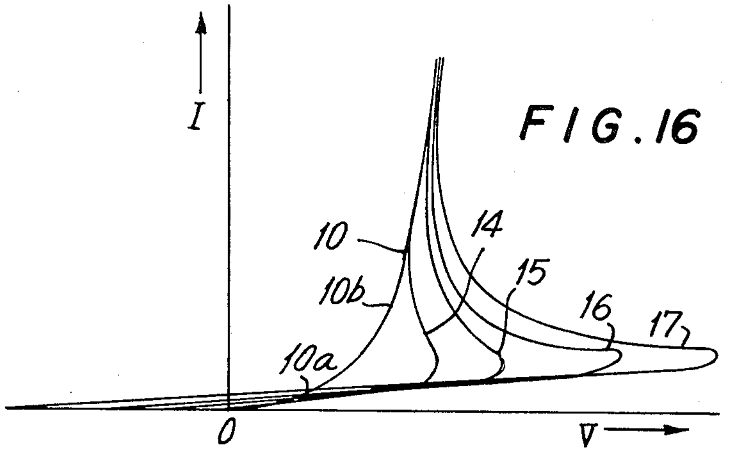
FIG. 16 is a graph showing characteristic curves for the circuit of FIG. 15.

In the circuit shown in FIGS. 11 and 13 the third region 3 is biased by a prescribed voltage in what is called "voltage control." It is possible that the prescribed bias may be provided by current supplied to the third region 3. FIG. 15 shows a current bias arrangement in which a transistor Tr has its emitter and collector connected in series with a battery E2 and then between the regions 3 and 2 to provide a constant current source to region 3. A bias for transistor Tr is provided by a battery E1 between its base and emitter. The characteristic of the circuit appearing at terminals *t*1 and *t*3 are shown in FIG. 16 as curves 14–17 for various values of current to region 3.

The operation of the circuit of FIG. 15 can be considered qualitatively as follows. When the third region 3 is reverse biased and the voltage V is low, holes injected from the first region 1 are collected by the third region 3. The current Ic which flows into the third region 3 is Ic =αI (where α is a current amplification factor). Thus the voltage V which is supplied to the terminals *t*1 –*t*2 increases and the current Ic is going to increase rapidly. But the third region 3 is connected to constant current source Tr, so that this current is kept at almost the same value, and the depletion layer near J3 is therefore contracted after the electric potential of the third region 3 approaches the electric potential to the substrate region. In this case, a part of the junction J3 opposite to the first region 1 is biased forwardly, and the holes are injected from said part which is biased forwardly to the region 3. Accordingly, there is a relationship between the current I which flows from the reverse biased part of junction J3 to the third electrode 3, and the current I which flows from the forward biased part of junction J3 to the substrate region, namely I1 and I2 that is I1 =Ic +I2. Thus, the carriers are injected from the third electrode 3 into substrate S and also the density slope of carriers and conductivity modulation increases, so that the depletion layer is contracted. Such functions add to each other, and the positive feedback function is larger with the current bias than with voltage control. Accordingly, this circuit shows in FIG. 16 larger negative resistance characteristic than does the voltage control type. Also, as shown in FIG. 16, when the current which is supplied to the third region 3 is large, one of the characteristics is notably s shaped.

Further, it is possible to connect the transistor Tr between regions 3 and 1 as shown in the dotted lines in FIG. 15.

Also, it is possible to employ voltage control and current control at the same time.

In FIGS. 11 and 15, the semiconductor substrate S is of the so called π type and the first and third electrodes are P type with high impurity concentrations, and the second electrode is n type. Therefore, this device may be called a PNP type device. However, it is possible that the substrate S is of the so called σ and the impurity regions in the first and second regions 1 and 3 are N type and the impurity for the second region 2 is P type.

Figure 17:
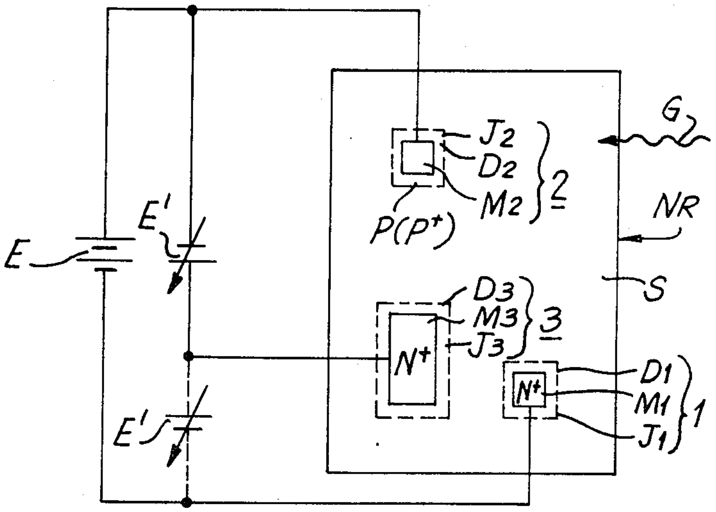
FIGS. 17 and 18 are schematic diagrams showing further variation of the second embodiment.
Figure 18:
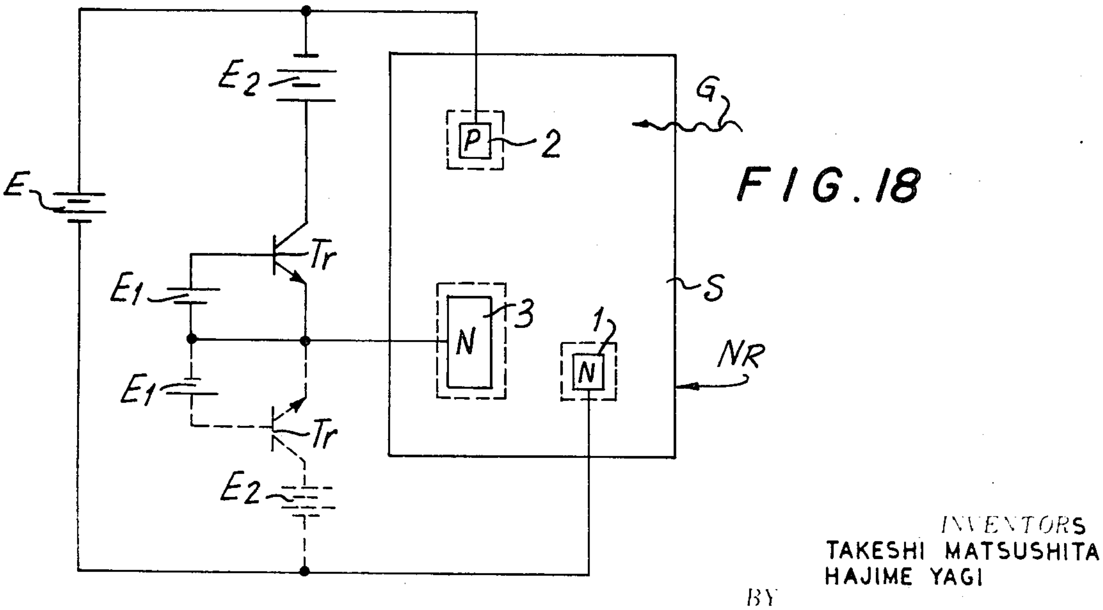

This type of a device may be called a NPN device. Such NPN devices are shown in FIGS. 17 and 18. The embodiment in FIG. 17 is voltage controlled and the embodiment in FIG. 18 is current controlled and analogous to FIGS. 11 and 15. The phantom lines show alternative connections as discussed above.

Figure 19:
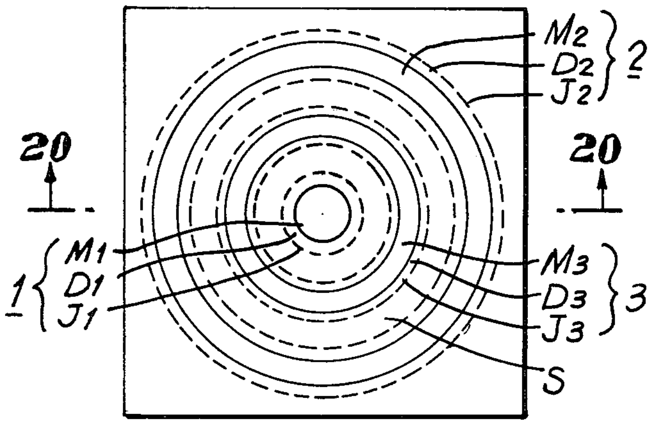
FIG. 19 is a plain view diagram of another device which may be used in the circuits of the invention.
Figure 20:
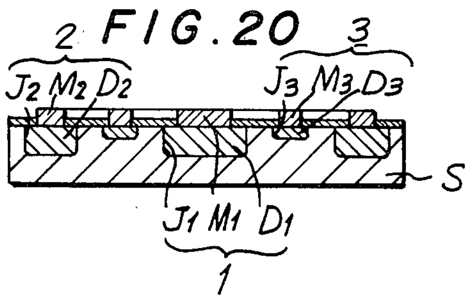
FIG. 20 is a diagram of sectional view taken along 20—20 on FIG. 19.

FIGS. 19 and 20 show a device having a modification of the arrangement of the regions 1, 2, 3. An isolation layer 50 for example $SiO_2$ covers a portion of the surface.

Figure 21:
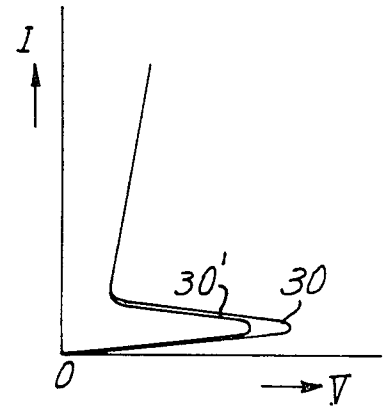
FIGS. 21 and 22 are diagrams showing variations in the characteristic curves of FIG. 16 due to light being applied on the device, as well as a magnetic field.
Figure 22:
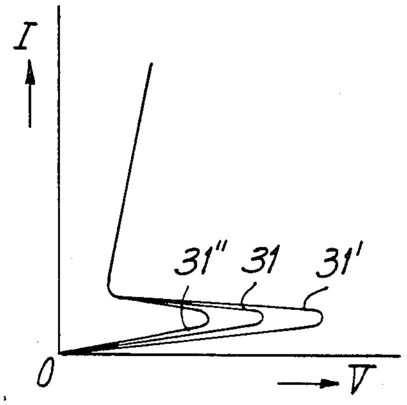

When light (shown schematically as wave G) is applied to the device, NR in any of the circuits shown in FIGS. 11, 13, 15, 17 or 18, the carriers in the substrate S increase, and the V–I characteristic changes as shown in FIG. 21 from curve 30 to 31′ (the curve 30 receives no light). Also, the device's operation is changed by the magnetic field (also shown schematically by wave G). For example, when the magnetic field +H is supplied to the substrate S, the characteristic shown in FIG. 22 on curve 30 is shifted to 31′ and when the magnetic held –H is applied, the characteristic curve shifts to the one shown as curve 31″.

Figure 23:
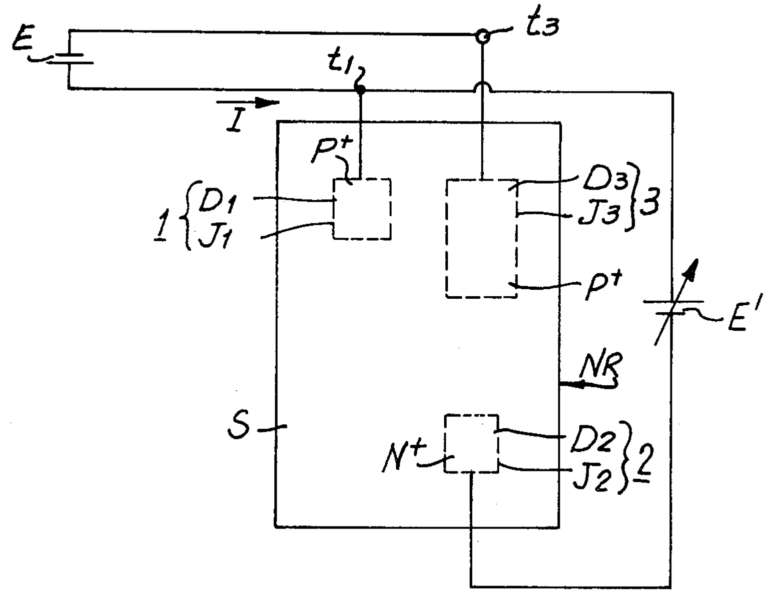
FIG. 23 is a schematic drawing of a circuit showing a third embodiment.
Figures 24, 25:
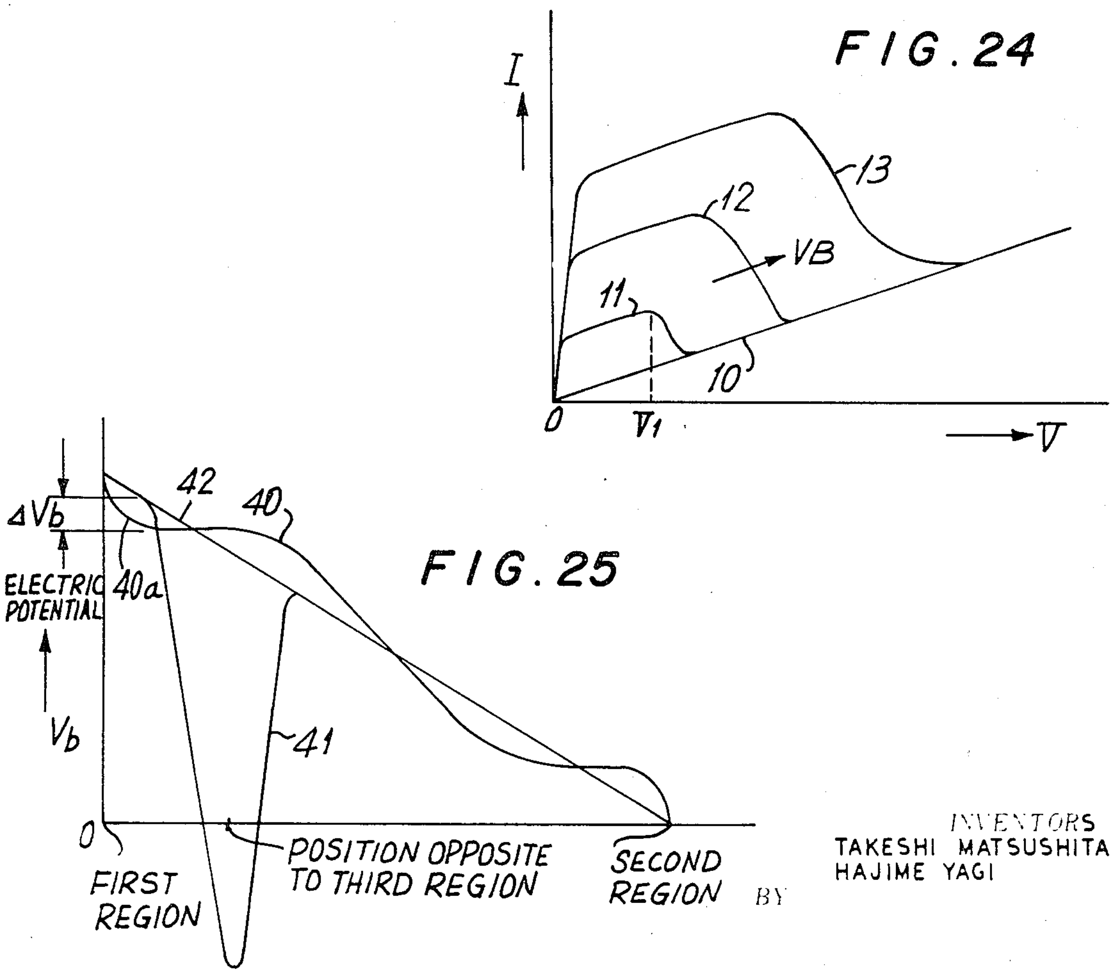
FIG. 24 is a graph showing characteristic curves for the embodiment in FIG. 23.
FIG. 25 is a graph showing a distribution of electric potential in the device as connected in a circuit of the third embodiment.

FIG. 23 shows still another embodiment in which the circuit exhibits a characteristic curve that has a negative resistance region of a modified n shape as shown in FIG. 24. FIG. 23 shows the device NR of FIG. 1 connected to a voltage source E′. Source E′ is connected between the regions 1 and 2 so as to forward bias them. A load (not shown) and a source E are connected in series, and across terminals *t*1 and *t*3, which are connected to the first and third regions 1 and 3. Source E provides a voltage V and is connected to keep the potential at region 1 higher than the potential of region 3. A current I, as shown in the figure, flows through the load terminals *t*1 and *t*3.

When a voltage VB of the source E′ is taken as a parameter, the volt-ampere characteristic curves of V (voltage from source E) vs. I (current into *t*1) are shown in FIG. 24. Here I is plotted against V for various values of VB.

The principle of the operation of this embodiment will now described. When the voltage VB of the source E′ is low, and the injection of holes from the first region 1 is small, the injected holes are collected by the third region 3, which is reverse biased due to battery E across *t*1–*t*3. In this case, the carrier concentration around the junction J3 in the substrate S is low. The V–I characteristic for this value of VB is shown as curve 10 in FIG. 24. Here the injection of carriers from the electrodes 1 and 2 is small and the current I through the third electrode 3 is also small.

When a larger voltage VB is applied, the curve 11 on FIG. 24 represents the characteristics. Here, the injection of holes is much greater and density slope of holes occurs in the substrate region, around the junction J3. In this condition, the electrons are injected from the second region 2 in order to satisfy with the neutral space-charge condition and the electrons and are distributed in proportion to the density slope of holes near junction J3. Thus, the electrons are going to diffuse to the third electrode 3 but the electrons cannot enter into the P+ type region D3 due to the depletion layer of the junction J3. As the voltage V increases, the depletion layer around J3 narrows and the reverse bias increases for junction J3. The characteristic shows a poor collector output characteristic until a voltage V1 is reached as shown on line 11 in FIG. 24. When the voltage increases, to exceed the value $V_1$, the depletion layer diffuses, and the current I relatively increases, and at last the density slope of holes near J3 disappears. Thereafter, the injection of electrons from the second electrode 2 reduces the impedance between the regions 1 and 2. Accordingly, the current through the first region is rapidly reduced. Thus the percentage of the decline of base current I, is much larger than the percentage of increase of (the current amplification factor by the diffusion of the depletion layer and) the voltage V. Therefore, it is submitted that this embodiment shows a negative resistance characteristic.

If the voltage VB is increased further, the characteristic curve is merely shifted, as is shown on lines 12 and 13 in FIG. 24.

Further, this embodiment shown in FIG. 23 shows a negative resistance characteristic according to the selection of the position of the third region 3. FIG. 25 is a graph showing the potential distribution in the device NR between regions 1 and 2 while the device is connected according to the circuit of FIG. 23. Curve 40 shows the distribution while there is no influence on the third region 3. When the voltage V increases, the potential becomes as shown on line 41 (i.e. a valley 41). As the voltage is further increased the distribution of potential approaches to the curve 42 which follows Ohm's law. If the valley 41 extends to the curve 41*a* the reverse bias against the third region 3 is larger, by ΔVB so that the depletion layer further diffuses, therefore the holes are caught and the density of holes in the substrate region reduces the negative resistance characteristic.

Figures 26, 27:
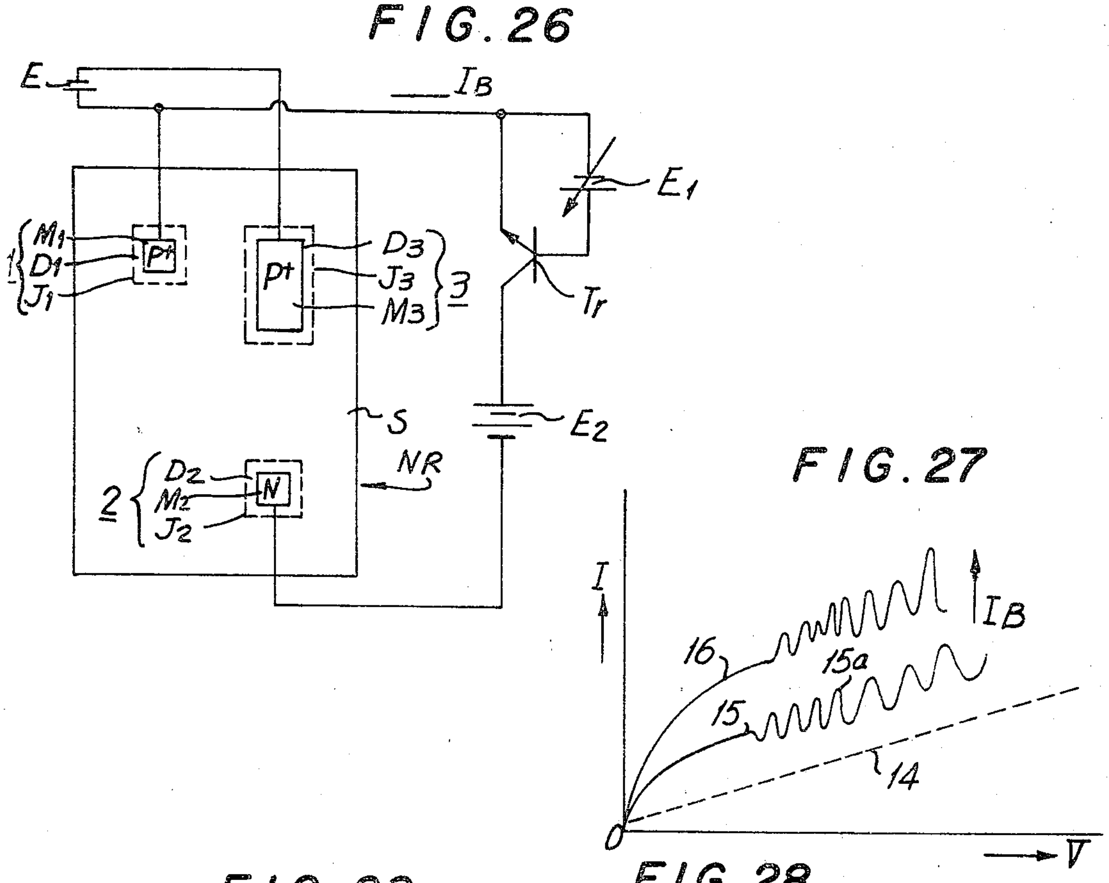
FIG. 26 is a schematic drawing of a variation of the third embodiment.
FIG. 27 is a graph showing characteristic curves for the embodiment in FIG. 26.

A variation of the third embodiment is shown in FIG. 26. The circuit here is of the so called current control type. A transistor Tr is connected, with its collector and emitter, in series with a voltage source E2, between region 1 and region 2. Transistor Tr is connected with a variable potential source $E_1$ between its base and emitter for controlling (i.e. keeping constant) a current flow IB through the regions 1 and 2. A characteristic curve of this circuit is shown in FIG. 27. As shown in this FIG., curves 15 and 16 are wave-shaped and include negative resistance portions. While the current IB is small, the characteristic of V and I follows curve 14. However, when the current IB is increased above a predetermined level so as to provide conductivity modulation between the regions 1 and 2, the curve shifts due to a depletion layer built up around the junction J2. When the voltage V is increased (with IB at a higher value, e.g. line 15) the depletion layer becomes spread out and the impedance between the regions 1 and 2 becomes larger, so that the current IB should reduce. However, the constant current source is connected between the regions 1 and 2 so that this source works to maintain the current IB constant. As the potential difference between the electrodes 1 and 2 increases (due to the current IB being constant and the impedance rising) the current I through the third electrode 3, increases. Thus the operation is repeated, and the wave curve 15*a* as shown occurs. Curve 16 shows the characteristics for a larger value of circuit IB.

It is possible to provide voltage control and current control at the same time. Also in FIGS. 23 and 26 the semiconductor substrate s is of the so called $\pi$ type as P type, and the first and third electrodes are of a P-type high impurity concentration, and the second electrode is N type, in what is called a PNP type device. However, it is possible to construct the substrate s of the so called $\sigma$ type as an N-type impurity and the regions D1 and D3 of the first and third regions are N type, and the region D2 of second region 2 is P type in what is so called an NPN type device.

Figures 28, 29:
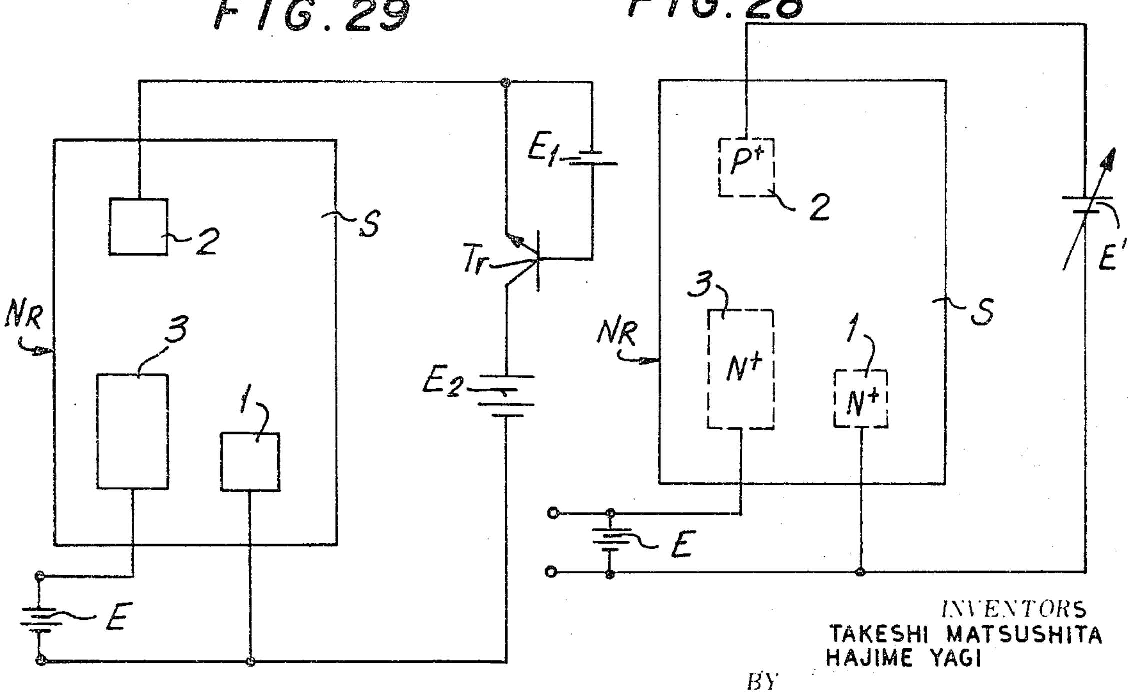
FIGS. 28 and 29 are schematic views of variations of the third embodiment.

Circuits having NPN type devices are shown in FIGS. 28 and 29. FIG. 29 is of the voltage control type, and FIG. 30 is of the current control type. It will be appreciated that the circuits of FIG. 28 and 29 are the same as the circuits of FIGS. 23 and 26 respectively, except for the different devices, and polarity reversal.

Furthermore, the V–I characteristic of the circuits of this third embodiment are changed by light or magnetic field falling on the device as described above in connection with the first and second embodiments.

It is possible that each impurity region D1, D2 and D3 is formed by an alloying method or by being grown. Also, it is possible that the regions 1, 2, 3 are not formed in a separate step but are formed by the metallic layers M1, M2, M3 on the substrate s. In this case, if the work function of the metallic layer is larger than the work function of the substrate S, the holes are injected into the substrate from it, and if the work function of the metallic layer is smaller than the work function of the substrate S, the electrons are injected into the substrate from it.

Although illustrative embodiments of this invention have been described in detail herein with reference to the accompanying drawings, it is to be understood that the invention is not limited to those precise embodiments, and that various changes and modifications may be effected therein by one skilled in the art without departing from the scope or spirit of the invention.

What is claimed is:

1. A circuit comprising a semiconductor device having a low conductivity substrate with three higher conductivity regions therein and on one plane surface thereof, a first one of said regions being of one conductivity type, a second of said regions being of the opposite conductivity type, and a third of said regions being of said one conductivity type; means for forwardly biasing said first and second regions; means for biasing said third region and wherein the distance between said first and third regions is less than the distance between said third and second regions, and the distance between said first and second third regions is more than the distance between said second and third regions.

2. A circuit comprising a semiconductor device having a low conductivity substrate with three higher conductivity regions therein, a first one of said regions being of one conductivity type, a second of said regions being of the opposite conductivity type, and a third of said regions being of said one conductivity type; means for forwardly biasing said first and second regions; and means for biasing said third region, the distance between said first and third regions being less than a distance between said third and second regions, and the distance between said first and second regions being greater than the distance between said second and third regions.

3. A circuit according to claim 2, wherein said bias means for the third region selectively reversed biases and forward biases said third region for producing a negative impedance between said regions of one conductivity and the region of the opposite conductivity as said bias means forward biases and back biases said third region.

4. A circuit according to claim 3, wherein said third biasing means is adapted to apply reverse and forward bias to the third region to partially forward bias that portion of said third region which is nearest to the second region and thereby reduce the impedance of the device.

5. A circuit according to claim 3, wherein said first and second region bias means includes a voltage source connected between the first and second regions, and said third region bias means includes a voltage source connected between said third and second regions.

6. A circuit according to claim 5, wherein the operating range of the third region bias means is variable and extends in amplitude above and below the voltage amplitude of the first and second region bias means.

7. A circuit according to claim 6, wherein said first and third regions are of P-type impurity and the second region of N-type impurity.

8. A circuit according to claim 7, wherein the two voltage sources are referenced to the second region and provide positive voltage to the first and third regions while operating in the negative impedance region.

9. A circuit according to claim 6, wherein said first and third regions are of N-type impurity and the second region of P-type impurity.

10. A circuit according to claim 9, wherein the two voltage sources are referenced to the second region to provide negative voltage to the first and third regions while operating in the negative impedance region.

11. A circuit according to claim 5, wherein a light signal is applied to said substrate to modulate the impedance of the device in the circuit.

12. A circuit according to claim 5, wherein a magnetic field is applied to said substrate to modulate the impedance of said device in the circuit.

13. A circuit according to claim 2, wherein said third region bias means is for back biasing said third region.

14. A circuit according to claim 13, wherein said third region bias means includes means for providing a predetermined bias, and means are provided for connecting a load with the forward bias means and varying the amplitude of said means.

15. A circuit according to claim 14, wherein said forward bias means includes a voltage source connected between the first and second regions, and said third region bias means includes a voltage source connected between said third and second regions.

16. A circuit according to claim 15, wherein said first and third regions are of P-type impurity and the second region of N-type impurity, and the forward voltage sources is connected to apply a positive voltage to the first region, and the third region voltage source is connected to apply a negative voltage to the third region.

17. A circuit according to claim 15, wherein said first and third regions are of N-type impurity and the second region of P-type impurity, and the forward voltage source is connected to provide a negative voltage to the first region, and the third region source is connected to apply a positive voltage to the third region.

18. A circuit according to claim 14, wherein said forward bias means includes a voltage source connected between the first and second regions, and said third region bias means includes a voltage source connected between said first and third regions.

19. A circuit according to claim 14, wherein said third region bias means includes a current source connected to said third region.

20. A circuit according to claim 13, wherein said forward bias means includes means for providing a predetermined bias, and means are provided for connecting a load with the third region bias means and varying the amplitude of said means.

21. A circuit according to claim 20, wherein said forward bias means includes a voltage source connected between the first and second regions, and said third region bias means includes a voltage source connected between said first and third regions.

22. A circuit according to claim 21, wherein said first and third regions are of P-type impurity and the second region of N-type impurity, and the forward voltage sources are connected with a positive voltage to the first region, and the third region voltage source is connected to apply a negative voltage to the third region.

23. A circuit according to claim 21, wherein said first and third regions are of N-type impurity and the second region of P-type impurity, and the forward voltage source is connected to provide a negative voltage to the first region, and the third region voltage source is connected to apply a positive voltage to the third region.

24. A circuit according to claim 20, wherein said forward bias means includes a current source connected to said second region.

25. A circuit according to claim 13, wherein a light signal is applied to said substrate to vary the impedance of the device in the circuit.

26. A circuit according to claim 13, wherein a magnetic field is applied to said substrate to vary the impedance of said device in the circuit.

* * * * *